(12) United States Patent
Vasan et al.

(10) Patent No.: US 10,756,685 B2
(45) Date of Patent: Aug. 25, 2020

(54) CHOPPER AMPLIFIER WITH DECOUPLED CHOPPING FREQUENCY AND THRESHOLD FREQUENCY

(71) Applicant: TEXAS INSTRUMENTS INCORPORATED, Dallas, TX (US)

(72) Inventors: Bharath Karthik Vasan, Tucson, AZ (US); Vadim Valerievich Ivanov, Tucson, AZ (US); Piyush Kaslikar, Tucson, AZ (US); Srinivas K. Pulijala, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/221,473

(22) Filed: Dec. 15, 2018

(65) Prior Publication Data

US 2020/0106400 A1 Apr. 2, 2020

Related U.S. Application Data

(60) Provisional application No. 62/737,948, filed on Sep. 28, 2018.

(51) Int. Cl.
*H03F 1/02* (2006.01)
*H03F 3/00* (2006.01)
*H03F 3/45* (2006.01)
*H03F 1/30* (2006.01)

(52) U.S. Cl.
CPC ......... *H03F 3/005* (2013.01); *H03F 3/45076* (2013.01); *H03F 1/303* (2013.01); *H03F 3/45475* (2013.01)

(58) Field of Classification Search
CPC .. H03F 3/005; H03F 3/45076; H03F 3/45475; H03F 1/303
USPC ............................................................. 330/9
See application file for complete search history.

(56) References Cited

U.S. PATENT DOCUMENTS

| | | | | |
|---|---|---|---|---|
| 7,292,095 B2 * | 11/2007 | Burt | ........................ | H03F 1/26 330/9 |
| 7,586,368 B2 * | 9/2009 | Trifonov | ................. | H03F 3/393 327/124 |
| 7,733,169 B2 * | 6/2010 | Zhang | ..................... | H03F 3/005 330/124 R |
| 7,973,596 B2 * | 7/2011 | Eschauzier | ............ | H03F 3/347 330/51 |
| 9,473,074 B1 * | 10/2016 | Blom | ........................ | H03F 1/26 |
| 9,641,142 B2 * | 5/2017 | Prasad | ..................... | H03F 3/393 |

* cited by examiner

*Primary Examiner* — Khanh V Nguyen
(74) *Attorney, Agent, or Firm* — John R. Pessetto; Charles A. Brill; Frank D. Cimino

(57) ABSTRACT

A chopper amplifier circuit includes a first amplifier path with chopper circuitry, a switched-capacitor filter, and multiple gain stages. The chopper amplifier circuit also includes a second amplifier path with a feed-forward gain stage. A chopping frequency of the chopper circuitry is greater than a threshold frequency at which the second amplifier path is used instead of the first amplifier path.

14 Claims, 7 Drawing Sheets

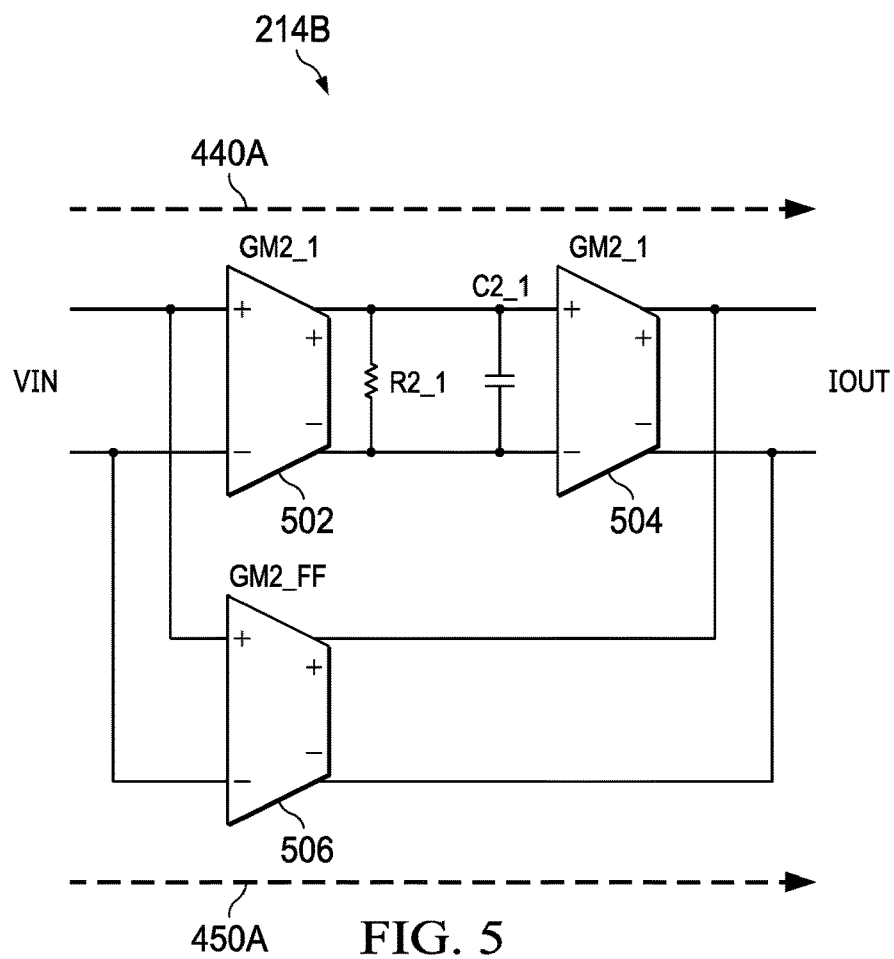
FIG. 5
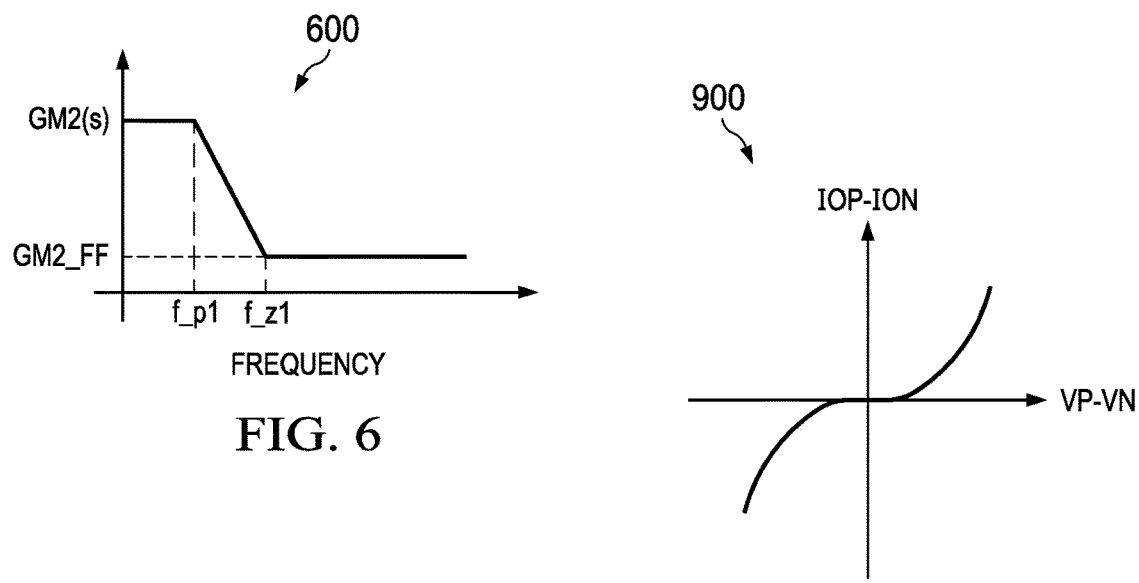
FIG. 6
FIG. 9

US 10,756,685 B2

CHOPPER AMPLIFIER WITH DECOUPLED CHOPPING FREQUENCY AND THRESHOLD FREQUENCY

CROSS REFERENCE TO RELATED APPLICATION

This application claims priority to U.S. Provisional Patent App. No. 62/737,948 filed Sep. 28, 2018 entitled "High-Bandwidth Low-Input Bias Current Chopper Amplifier Architecture", which is incorporated herein by reference.

BACKGROUND

Modern electronic systems involve different circuits and networks, where the voltage or current levels of signals conveyed along links between components or circuits are often adjusted. Signal amplifier circuits are one type of circuit that is used to adjust the voltage or current levels of signals along a link, where the goal of signal amplification is to increase signal strength without introducing errors like offset voltage, noise, distortion, etc. There are several different signal amplifier topologies, each suitable for different scenarios.

One signal amplifier topology is referred to as a chopper amplifier. In an example chopper amplifier topology, the chopping frequency is a function of the bandwidth (increasing the bandwidth necessitates an increase in the chopping frequency).

Unfortunately, increasing the chopping frequency of a chopper amplifier to increase the bandwidth results in an undesirable increase in the input bias current. The input bias current is directly proportional to chopping frequency as the chopping frequency determines the number of times a charge-transfer occurs per second on the inputs. This is because charge transfer from clock-feedthrough and charge-injection from the input chopper switches contribute to an increased input bias current in chopper amplifiers. To the extent the input bias current level interacts with an input source's impedance, an error voltage is introduced in the signal path.

SUMMARY

In accordance with at least one example of the disclosure, a chopper amplifier circuit comprises a first amplifier path with chopper circuitry, a switched-capacitor filter, and multiple gain stages. The chopper amplifier circuit also comprises a second amplifier path with a feed-forward gain stage. A chopping frequency of the chopper circuitry is greater than a threshold frequency at which the second amplifier path is used instead of the first amplifier path.

In accordance with at least one example of the disclosure, a system comprises a chopper amplifier circuit having a first amplifier path with chopper circuitry, a switched-capacitor filter, a first gain stage before the switched capacitor filter, and a second gain stage after the switched filter. The chopper amplifier circuit also comprises a second amplifier path with a feed-forward gain stage, wherein a chopping frequency of the chopper circuitry is greater than a threshold frequency at which the second amplifier path is used instead of the first amplifier path. The chopper amplifier circuit is configured to receive a differential input signal.

BRIEF DESCRIPTION OF THE DRAWINGS

For a detailed description of various examples, reference will now be made to the accompanying drawings in which:

FIG. 5 is a schematic diagram showing a post-filter gain stage in accordance with various examples;

FIG. 6 is a graph showing gain as a function of frequency for the post-filter gain stage of FIG. 5;

FIG. 9 is a graph showing a differential output current as a function of a differential input voltage for a gain stage in accordance with various examples.

DETAILED DESCRIPTION

Disclosed herein are chopper amplifier topologies, systems, and methods that decouple a chopper frequency and a threshold frequency used to select between different amplifier paths of the chopper amplifier. Decoupling the chopper frequency from the threshold frequency enables the chopper amplifier to meet predetermined design goals for input bias current (e.g., input bias current below a target) and bandwidth (e.g., bandwidth above a target). In different examples, the bandwidth and input bias current targets vary. Without limitation, the disclosed chopper amplifier topologies are useful in systems, such as an instrumentation or sensing system, where small signals need to be amplified without distortion (or with distortion less than a threshold).

In some examples, the disclosed chopper amplifiers employ a first amplifier path and a second amplifier path. The first amplifier path includes a gain stage, chopper circuitry, a switched-capacitor filter, and at least one gain stage after the switched-capacitor filter (referred to as a post-filter gain stage). Meanwhile, the second amplifier path includes a feed-forward gain stage. In accordance with at least some examples, the first amplifier path includes a post-filter gain stage that sets the threshold frequency so that the threshold frequency is decoupled from a chopping frequency of the chopper circuitry. In one example, the post-filter gain stage sets the threshold frequency based on a relationship GM2/CM2, where GM2 is the transconductance of the post-filter gain stage and CM2 is a capacitance associated with the post-filter gain stage. In another example, the post-filter gain stage has first and second parallel gain paths, where the first parallel gain path includes cascaded gain stages, and where the second parallel gain path includes a feed-forward gain stage. In at least some examples, the gain of the first parallel gain path is higher than the gain of the second parallel gain path. Also, the first parallel gain path applies to frequencies below a threshold frequency, while the second parallel gain path applies to frequencies above the threshold frequency. With either of these post-filter gain stage options, the threshold frequency is decoupled from and is smaller than the chopping frequency. To provide a better understanding, various chopper amplifier options, post-filter gain stage options, and related issues are described using the figures as follows.

Figure 1:
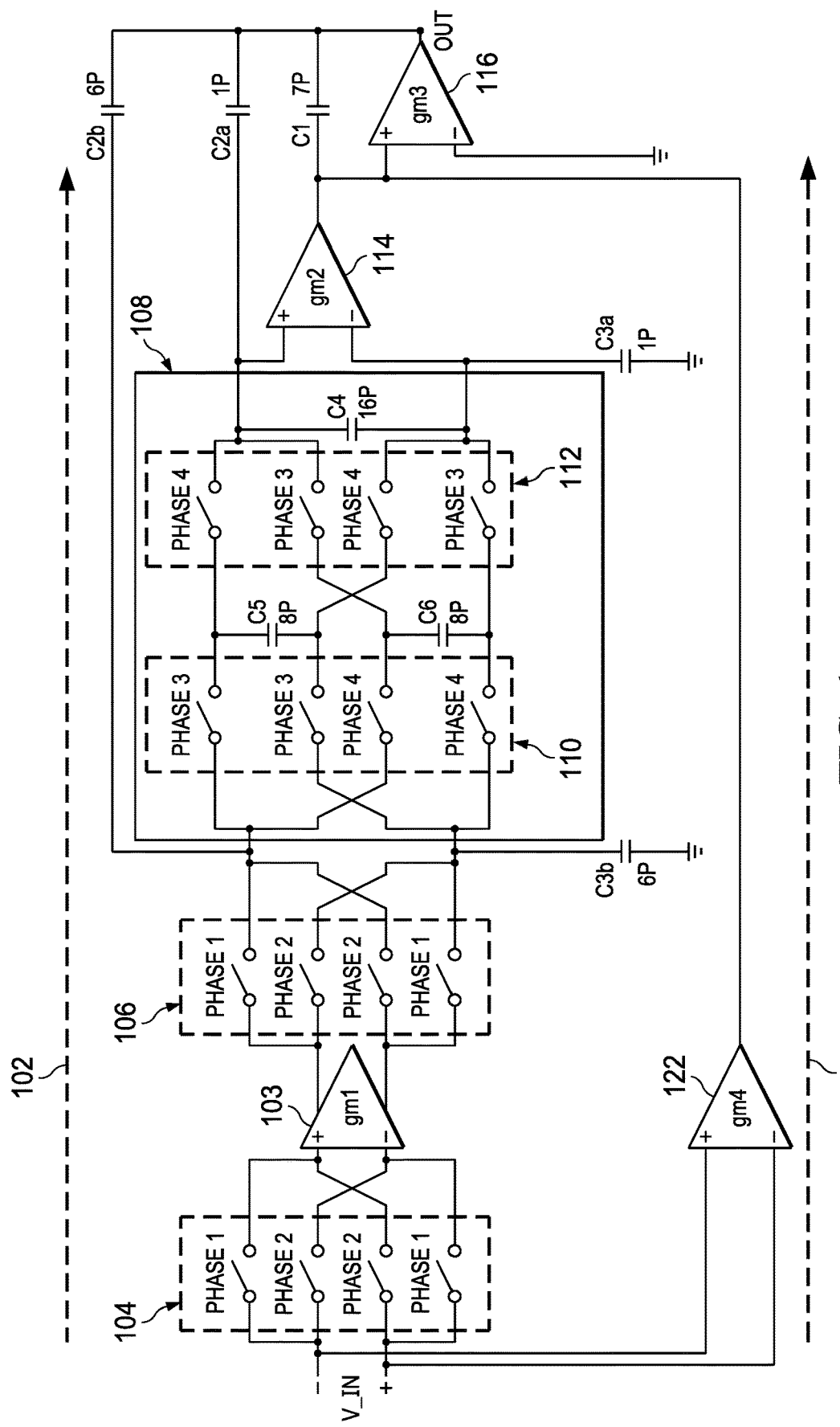
FIG. 1 is a schematic diagram showing a chopper amplifier topology.

FIG. 1 is a schematic diagram showing an example chopper amplifier 100. In the example of FIG. 1, the chopper amplifier 100 includes a first amplifier path 102 and a second amplifier path 120, each receiving a differential input signal (V_IN) at its input. In some examples, V_IN is provided by input-side circuit (e.g., the input-side circuit is either part of the same integrated circuit as the chopper amplifier 100 or is part of another integrated circuit, chip, or device). The first amplifier path 102 includes a set of switches 104 and a first gain stage (gm1) 103, where the set of switches 104 sample V_IN based on a chopping frequency. The sampled and amplified V_IN is passed to a filter 108 (to remove chopping noise) via another set of switches 106. In FIG. 1, the control signals for the sets of switches 104 and 106 are labeled "phase1" and "phase2", where the phase1 and phase2 signals do not overlap.

As shown, the filter 108 comprises two capacitors (labeled C5 and C6) between two sets of switches 110 and 112. Another capacitor (labeled C4) couples to the set of switches 112 and provides the output for the filter 108. The sets of switches 110 and 112 are directed by control signals (labeled "phase3" and "phase4"). In some examples, phase3 is shifted 90 degrees from phase1, and phase 4 is shifted 90 degrees from phase 2. The output of the filter 108 is provided to a second gain stage (gm2) 114 of the chopper amplifier 100. The output of the second gain stage 114 is provided to a third gain stage (gm3) 116 of the chopper amplifier 100. In some examples, the first amplifier path 102 amplifies frequencies of V_IN that are below a threshold using the first gain stage 103, the second gain stage 114, and the third gain stage 116.

Meanwhile, the second amplifier path 120 of the chopper amplifier 100 amplifies frequencies of V_IN that are above the threshold. As shown, the second amplifier path 120 includes a feed-forward gain stage (gm4) 122, where the output of the feed-forward gain stage 122 is provided to the third gain stage 116. Thus, the second amplifier path 120 amplifies frequencies of V_IN that are above a threshold using the feed-forward gain stage 122 and the third gain stage 116. In FIG. 1, the chopper amplifier 100 also includes various capacitors (e.g., C1, C2a, C2b, C3a, C3b) that are used for frequency compensation. In the example chopper amplifier 100, increasing the bandwidth of the chopper amplifier 100 requires that the chopping frequency be proportionally increased at the expense of increasing the input bias current (resulting in increased amplifier error).

Figure 2:
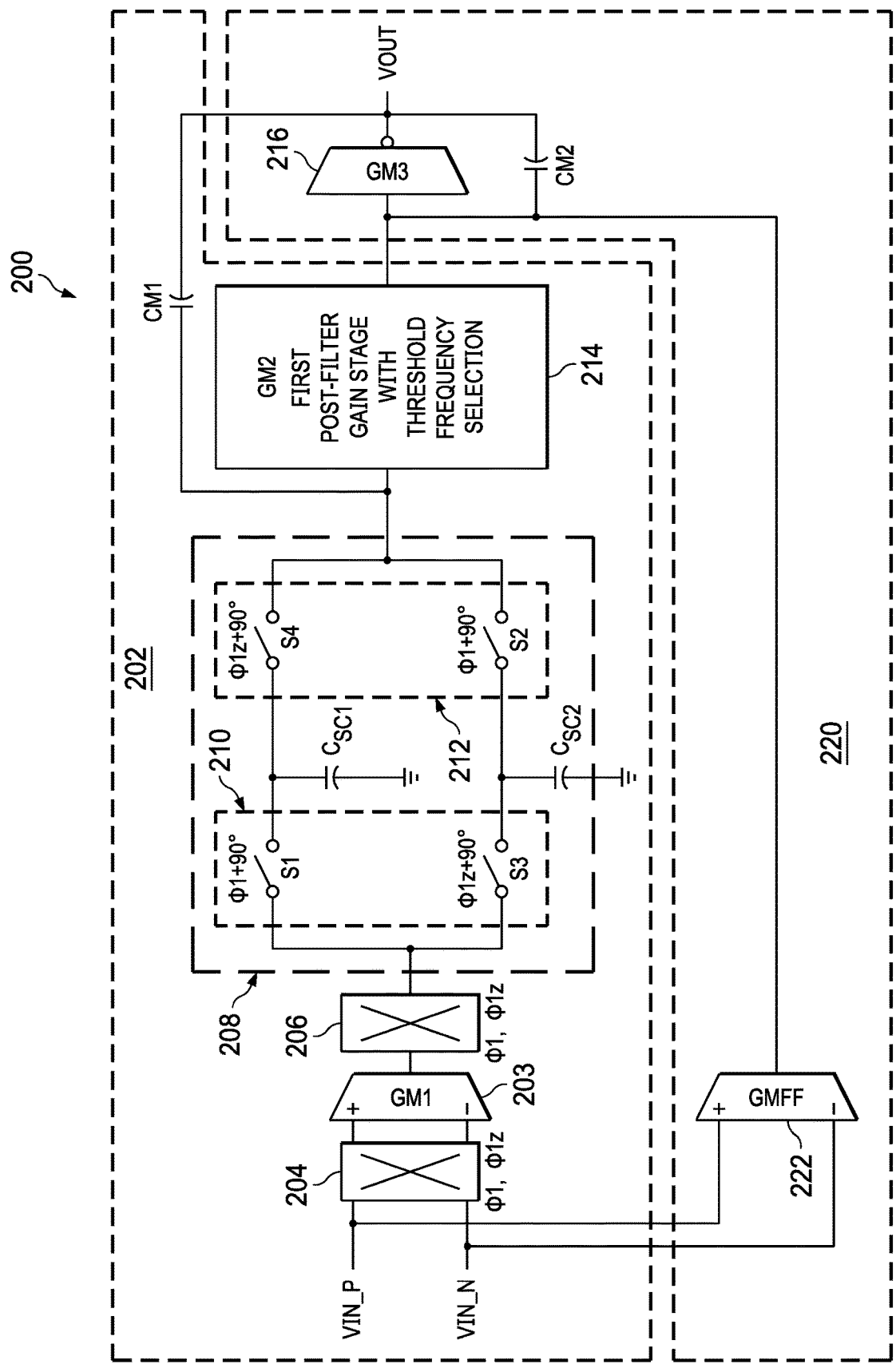
FIG. 2 is a schematic diagram showing another chopper amplifier topology in accordance with various examples.

FIG. 2 is a schematic diagram showing another chopper amplifier 200 in accordance with various examples. As shown, the chopper amplifier 200 includes a first amplifier path 202 and a second amplifier path 220, each receiving a differential input signal (VIN_P and VIN_N, which corresponds to V_IN in FIG. 1) at its input. In some examples, VIN_P and VIN_N are provided by input-side circuit (e.g., the input-side circuit is either part of the same integrated circuit as the chopper amplifier 200 or is part of another integrated circuit, chip, or device). The first amplifier path 202 includes a set of switches 204 and a first gain stage (GM1) 203, where the set of switches 204 sample VIN_P and VIN_N based on a chopping frequency. The sampled and amplified VIN_P and VIN_N is passed to a filter 208 (to remove chopping noise) via another set of switches 206. In FIG. 2, the control signals for the sets of switches 204 and 206 are labeled "φ1" and "φ1z", where the φ1 and φ1z signals do not overlap.

In FIG. 2, the filter 208 comprises two capacitors (labeled $C_{SC1}$ and $C_{SC2}$) and two sets of switches 210 and 212. More specifically, a first electrode of $C_{SC1}$ couples to S1 of the set of switches 210, and to S4 of the set of switches 212. A second electrode of $C_{SC1}$ couples to a ground node. Meanwhile, a first electrode of $C_{SC2}$ couples to S3 of the set of switches 210, and to S2 of the set of switches 212. A second electrode of $C_{SC2}$ couples to a ground node. The sets of switches 210 and 212 are directed by control signals (labeled "φ1+90°" and "φ1z+90°"). More specifically, S1 and S2 are directed by the φ1+90° signal, and S3 and S4 are directed by the φ1z+90° signal. The output of the filter 208 is provided to a second gain stage or a first post-filter gain stage (GM2) 214 with threshold frequency selection.

In some examples, the post-filter gain stage 214 selects the threshold frequency based on the relationship GM2/CM2, where GM2 is the transconductance of the post-filter gain stage and CM2 is a first frequency compensation capacitance. In other examples, the post-filter gain stage 214 selects the threshold frequency using parallel gain paths (see e.g., the post-filter gain stage 114A of FIG. 4). More specifically, in some examples, the first parallel gain path includes cascaded gain stages (see e.g., GM2_1 and GM2_2 in FIG. 4), and the second parallel gain path includes a feed-forward gain stage (see e.g., GM2_FF in FIG. 4). In at least some examples, the gain of the first parallel gain path is higher than the gain of the second parallel gain path. Also, the first parallel gain path applies to frequencies below a threshold, while the second parallel gain path applies to frequencies above the threshold. The output of the post-filter gain stage 214 is provided to a third gain stage or second post-filter gain stage (GM3) 216 of the chopper amplifier 200. In some examples, the first amplifier path 202 amplifies frequencies of VIN_N and VIN_P that are below a threshold frequency using the first gain stage 203, the second gain stage 214, and the third gain stage 216.

Meanwhile, the second amplifier path 220 of the chopper amplifier 200 amplifies frequencies of VIN_N and VIN_P that are above the threshold frequency. As shown, the second amplifier path 220 includes a feed-forward gain stage (GMFF) 222, where the output of the feed-forward gain stage 222 is provided to the third gain stage or second post-filter gain stage (GM3) 216. Thus, in some examples, the second amplifier path 220 amplifies frequencies of VIN_N and VIN_P that are above a threshold frequency using the feed-forward gain stage (GMFF) 222 and the third gain stage (GM3) 216. The chopper amplifier 200 also includes various capacitors (e.g., CM1, CM2) to provide frequency compensation for the chopper amplifier 200. It should be noted that while the different threshold frequency selection options for post-filter gain stage 214 are valid, the use of parallel gain paths for the post-filter gain stage 214 has the benefit of rejecting offset voltages from the second amplifier path 220.

Figure 3:
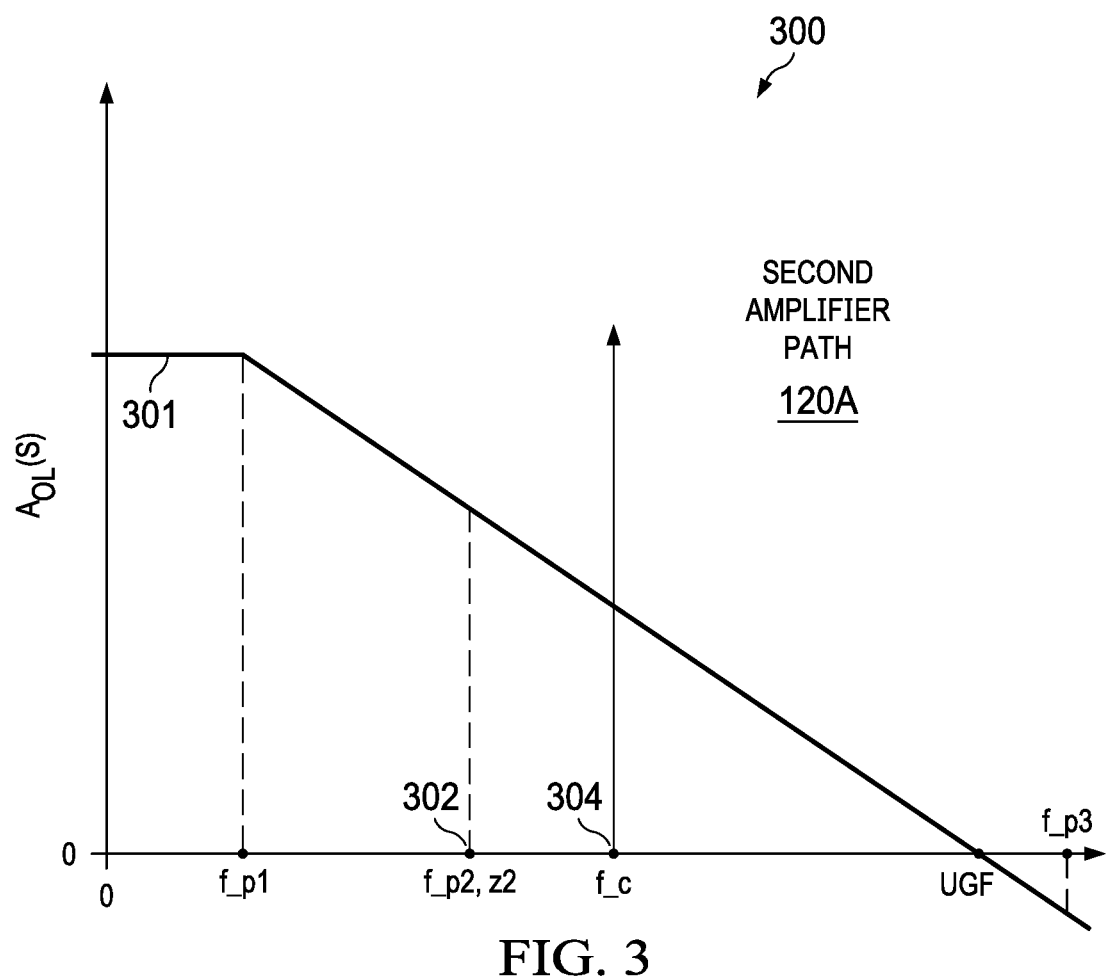
FIG. 3 is a graph showing chopper amplifier gain as a function of frequency in accordance with various examples.

FIG. 3 is a graph 300 showing chopper amplifier gain 301 as a function of frequency in accordance with various examples. In graph 300, the chopper amplifier gain 301 is referred to as $A_{OL}(s)$ and changes as a function of frequency. In graph 300, various poles, zeroes, and related frequencies are identified, including a dominant pole frequency (f_p1), a non-dominant pole frequency (f_p3), a pole-zero doublet frequency (f_p2, z2), a threshold frequency 302, a chopping frequency (f_c) 304, and a unity gain frequency (UGF). As shown in graph 300, $A_{OL}(s)$ at low frequencies below f_p1 is relatively constant until the dominant pole 308 associated with f_p1. After f_p1, $A_{OL}(s)$ falls as a function of frequency. In some examples, $A_{OL}(s)$ for frequencies below a threshold frequency 302 is provided by a first amplifier path (e.g., the first amplifier path 202). In some examples, the threshold frequency 302 (referred to as the stitching frequency) is set by the pole-zero doublet associated with f_p2,z2. In most cases, p2=z2, where z2 is given by $$z2 = -\frac{GM1}{CM1} * \frac{GM2\_FF}{GMFF},$$

where GM is the transconductance of a first gain stage (e.g., gain stage 203), GM2_FF is the transconductance of a feed-forward gain stage along a second parallel gain path of the post-filter gain stage 214 (see e.g., FIG. 5), GMFF is the transconductance of a feed-forward gain stage (e.g., the feed-forward gain stage 222 in FIG. 2) for a second amplifier path (e.g., the second amplifier path 220 in FIG. 2), and CM1 is a first frequency compensation capacitance for a chopper amplifier (e.g., the chopper amplifier 200 of FIG. 2). In other examples, the threshold frequency 302 is set by the relationship GM2/CM2, where GM2 is the transconductance of a post-filter gain stage (e.g., the post-filter gain stage 214 of FIG. 2) and CM2 is a second compensation frequency capacitance for a chopper amplifier (e.g., the chopper amplifier 200 of FIG. 2). Above the threshold frequency 302, $A_{OL}(s)$ continues to fall, where UGF corresponds to $A_{OL}(s)=0$. At f_p3, the rate at which $A_{OL}(s)$ falls increases. $A_{OL}(s)$ for frequencies above the threshold frequency 302 is provided by a second amplifier path (e.g., the second amplifier path 220). Also, it should be noted that f_c 304 is above the threshold frequency 302.

In some examples, f_c 304 is set to a low enough value such that the input bias current is below an input bias current target. To ensure the phase delay of the switched-capacitor filter does not affect the overall stability of the system, the threshold frequency 302 is set lower than f_c 304 as shown in graph 300. In some examples, f_c 304 is at least two times the threshold frequency 302.

Figure 4:
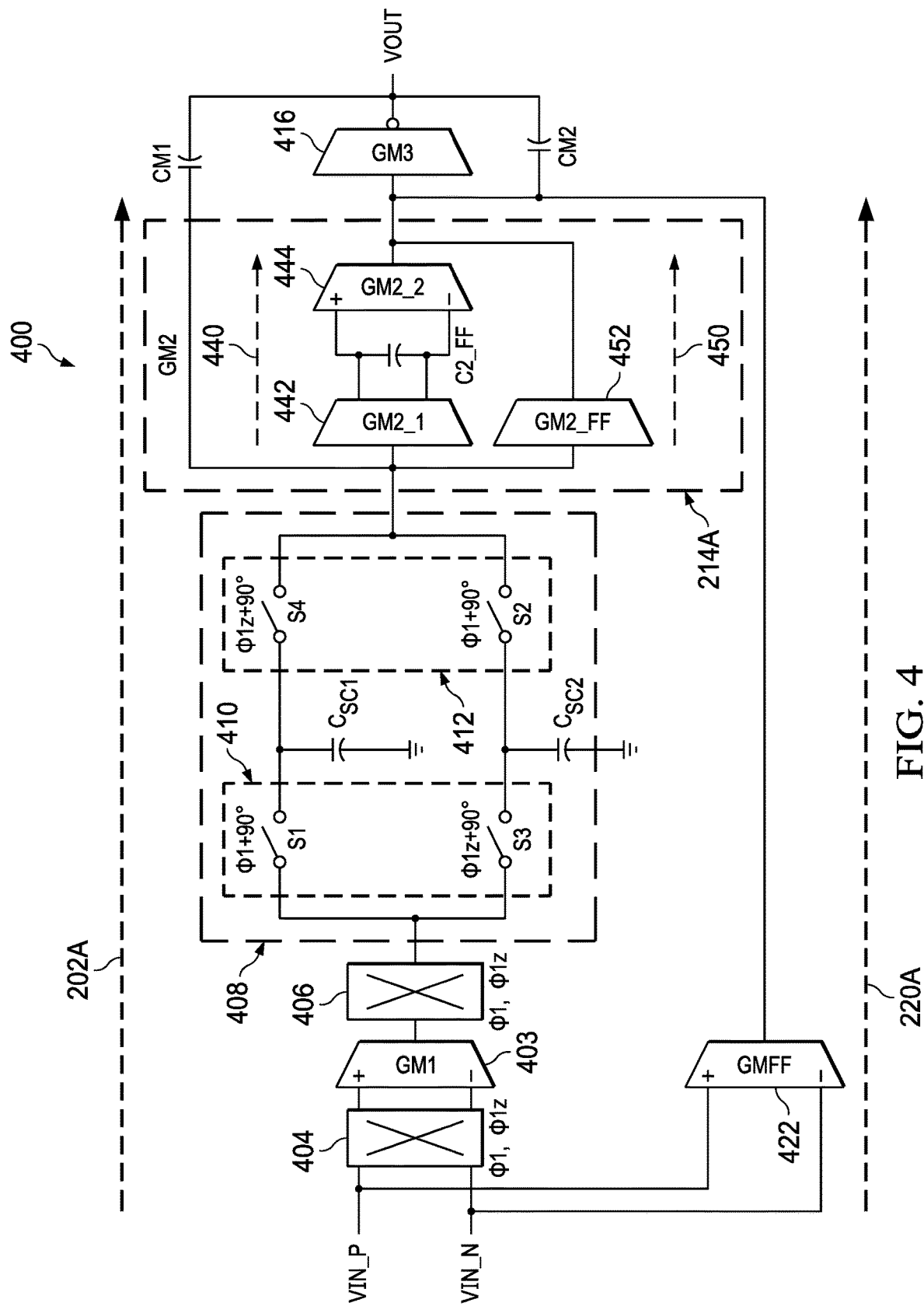
FIG. 4 is a schematic diagram showing another chopper amplifier in accordance with various examples.

FIG. 4 is a schematic diagram showing another chopper amplifier 400 in accordance with various examples. As shown, the chopper amplifier 400 includes a first amplifier path 202A (an example of the first amplifier path 202 in FIG. 2) and a second amplifier path 220A (an example of the second amplifier path 220 in FIG. 2), each receiving a differential input signal (VIN_P and VIN_N) at its input. In some examples, VIN_P and VIN_N are provided by input-side circuitry (e.g., the input-side circuitry is either part of the same integrated circuit as the chopper amplifier 400 or is part of another integrated circuit, chip, or device). The first amplifier path 202A includes a set of switches 404 and a first gain stage 403, where the set of switches 404 sample VIN_P and VIN_N based on a chopping frequency. The sampled and amplified VIN_P and VIN_N is passed to a filter 408 (to remove chopping noise) via another set of switches 406. In FIG. 4, the control signals for the sets of switches 404 and 406 are labeled "φ1" and "φ1 z", where the φ1 and φ1z signals do not overlap.

In FIG. 4, the filter 408 comprises two capacitors (labeled $C_{SC1}$ and $C_{SC2}$) and two sets of switches 410 and 412. More specifically, a first electrode of $C_{SC1}$ couples to S1 of the set of switches 410, and to S4 of the set of switches 412. A second electrode of $C_{SC1}$ couples to a ground node. Meanwhile, a first electrode of $C_{SC2}$ couples to S3 of the set of switches 410, and to S2 of the set of switches 412. A second electrode of $C_{SC2}$ couples to a ground node. The sets of switches 410 and 412 are directed by control signals (labeled "φ1+90°" and "φ1z+90°"). More specifically, S1 and S2 are directed by the φ1+90° signal, and S3 and S4 are directed by the φ1z+90° signal. The output of the filter 408 is provided to a second gain stage or a first post-filter gain stage 214A (an example of the first post-filter gain stage 214 of FIG. 2) with parallel gain paths 440 and 450.

In some examples, the post-filter gain stage 214A includes a first parallel gain path 440 and a second parallel gain path 450. More specifically, in some examples, the first parallel gain path 440 includes cascaded gain stages 442 and 444, and the second parallel gain path 450 includes a feed-forward gain stage 452. As shown, the first parallel gain path 440 also includes a capacitor (C2_FF) between the cascaded gain stages 442 and 444. In at least some examples, the gain of the first parallel gain path 440 is higher than the gain of the second parallel gain path 450. Also, the first parallel gain path 440 applies to frequencies below a threshold frequency, while the second parallel gain path 450 applies to frequencies above the threshold frequency.

The output of the post-filter gain stage 214A is provided to a third gain stage or second post-filter gain stage 416 of the chopper amplifier 400. In some examples, the first amplifier path 202A amplifies frequencies of VIN_N and VIN_P that are below a threshold frequency (e.g., the threshold frequency 302 in FIG. 3). Meanwhile, the second amplifier path 220A of the chopper amplifier 400 amplifies frequencies of VIN_N and VIN_P that are above the threshold frequency (e.g., the threshold frequency 302 in FIG. 3). As shown, the second amplifier path 220A includes a feed-forward gain stage 422, where the output of the feed-forward gain stage 422 is provided to the third gain stage or second post-filter gain stage 416. Thus, in some examples, the third gain stage 416 is shared by the first amplifier path 202A and the second amplifier path 220A. The chopper amplifier 400 also includes various capacitors (e.g., CM1, CM2) that are used for frequency compensation for the chopper amplifier 400. It should be noted that the use of parallel gain paths for the post-filter gain stage 214A to set the threshold frequency (e.g., using $$-\frac{GM1}{CM1} * \frac{GM2\_FF}{GMFF}$$

to set the threshold frequency) has the benefit of rejecting offset voltages from the second amplifier path 220A (compared to using GM2/CM2 to set the threshold frequency).

FIG. 5 is a schematic diagram showing a post-filter gain stage 214B in accordance with various examples. In FIG. 5, the post-filter gain stage 214B is an example of the post-filter gain stage 214 of FIG. 2, or the post-filter gain stage 214A of FIG. 4. As shown, the post-filter gain stage 214B includes a first parallel gain path 440A (an example of the first parallel gain path 440 of FIG. 4) and a second parallel gain path 450A (an example of the second parallel gain path 450 of FIG. 4). The first parallel gain path 440A includes cascaded gain stages 502 and 504, where the gain stages 502 and 504 are examples of the gain stages 442 and 444 in FIG. 4. As shown, the first parallel gain path 440A includes a resistor (R2_1) and a capacitor (C2_1) between the gain stages 502 and 504. The second parallel gain path 450A includes a feed-forward gain stage 506 (an example of the feed-forward gain stage 452 of FIG. 4). In at least some examples, the gain of the first parallel gain path 440A is higher than the gain of the second parallel gain path 450A. Also, the first parallel gain path 440A applies to frequencies below a threshold, while the second parallel gain path 450A applies to frequencies above the threshold frequency. Also, in some examples, the cascaded gain stages 502 and 504 are configured to reject offset from a feed-forward gain stage (e.g., the feed-forward gain stage 422 of FIG. 4) at low frequencies.

In some examples, the post-filter gain stage 214A of FIG. 4 involves selection of poles and zeroes to realize the $A_{OL}(s)$ transfer function of FIG. 3. More specifically, for the post-filter gain stage 214A, $$GM2(s) = \frac{\partial IOUT(s)}{\partial VIN(s)},$$

where $\partial IOUT(s)$ is the change in output current as a function of frequency, and where $\partial VIN(s)$ is the change in input voltage as a function of frequency. Also, $$p1 = -\frac{1}{R2\_1 * C2\_1},$$

where R2_1 is the resistance associated with cascaded gain stages along the first parallel gain path of a post-filter gain stage (see e.g., FIG. 5) and C2_1 is a capacitance associated with cascaded gain stages along a first parallel gain path of a post-filter gain stage (see e.g., FIG. 5). Also, $$z1 = -\frac{GM2\_1}{C2\_1} * \frac{GM2\_2}{GM2\_FF},$$

where GM2_1 is the transconductance of a first cascaded gain stage along the first parallel gain path of a post-filter gain stage (see e.g., FIG. 5), GM2_2 is the transconductance of a second cascaded gain stage along the first parallel gain path of a post-filter gain stage (see e.g., FIG. 5), GM2_FF is the transconductance of a feed-forward gain stage along the second parallel gain path of a post-filter gain stage (see e.g., FIG. 5), and C2_1 is a capacitance associated with cascaded gain stages along the first parallel gain path (see e.g., FIG. 5). In some examples, GM2_1*R2_1*GM2_2 is set to be large enough to reduce low frequency noise and voltage offset sources from the feed-forward gain stage of a second amplifier path (e.g., GMFF 222 in FIG. 2). Also, in some examples, p1,z1 is set lower than the threshold frequency (e.g., the threshold frequency 302 in FIG. 3). Also, in some examples, GM2_FF is used to set the threshold frequency (e.g., the threshold frequency 302 in FIG. 3). In one examples, GM2_FF sets the threshold frequency based on the relationship $$-\frac{GM1}{CM1} * \frac{GM2\_FF}{GMFF}.$$

FIG. 6 is a graph 600 showing gain, GM2(s), as a function of frequency for the post-filter gain stage 214B of FIG. 5. As shown, GM2(s) is at a relatively constant level at frequencies below a dominant pole frequency, f_p1, where GM2(s) is determined by the first parallel gain path 440A in FIG. 5. After f_p1, GM2(s) falls until a zero frequency, f_z1. After f_z1, GM2(s) stays constant at GM2_FF, where GM2_FF is determined by the second parallel gain path 450A in FIG. 5. With a gain curve such as GM2(s), a post-filter gain stage (e.g., the first post-filter gain stage 214B of FIG. 5) enables the bandwidth of a chopper amplifier (e.g., the chopper amplifier 200 of FIG. 2, the chopper amplifier 200 of FIG. 2, or the chopper amplifier 400 of FIG. 4) to be above a target bandwidth while an input bias current is below a target input bias current.

Figure 7:
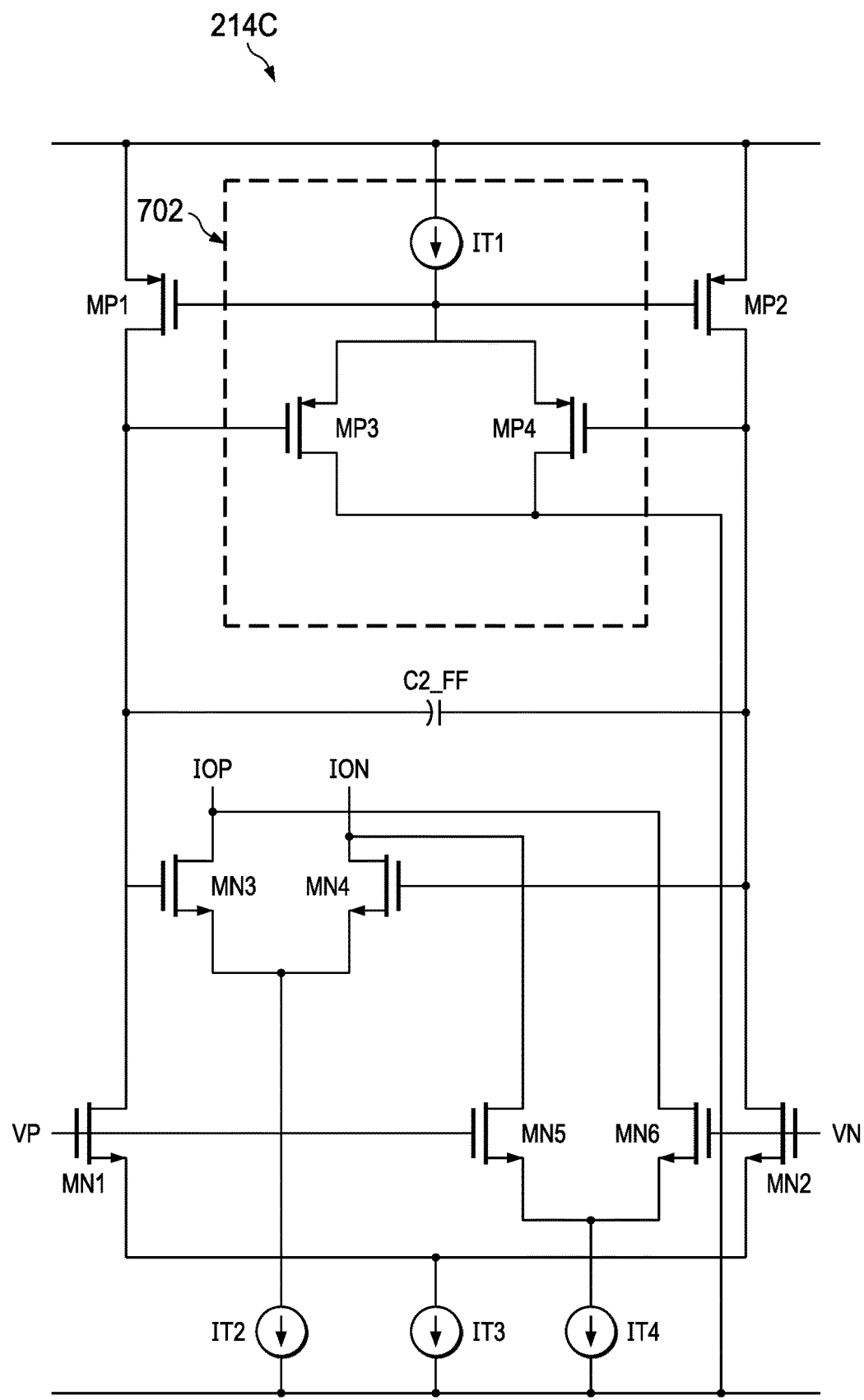
FIGS. 7 and 8 are schematic diagrams showing post-filter gain stage options in accordance with various examples.
Figure 8:
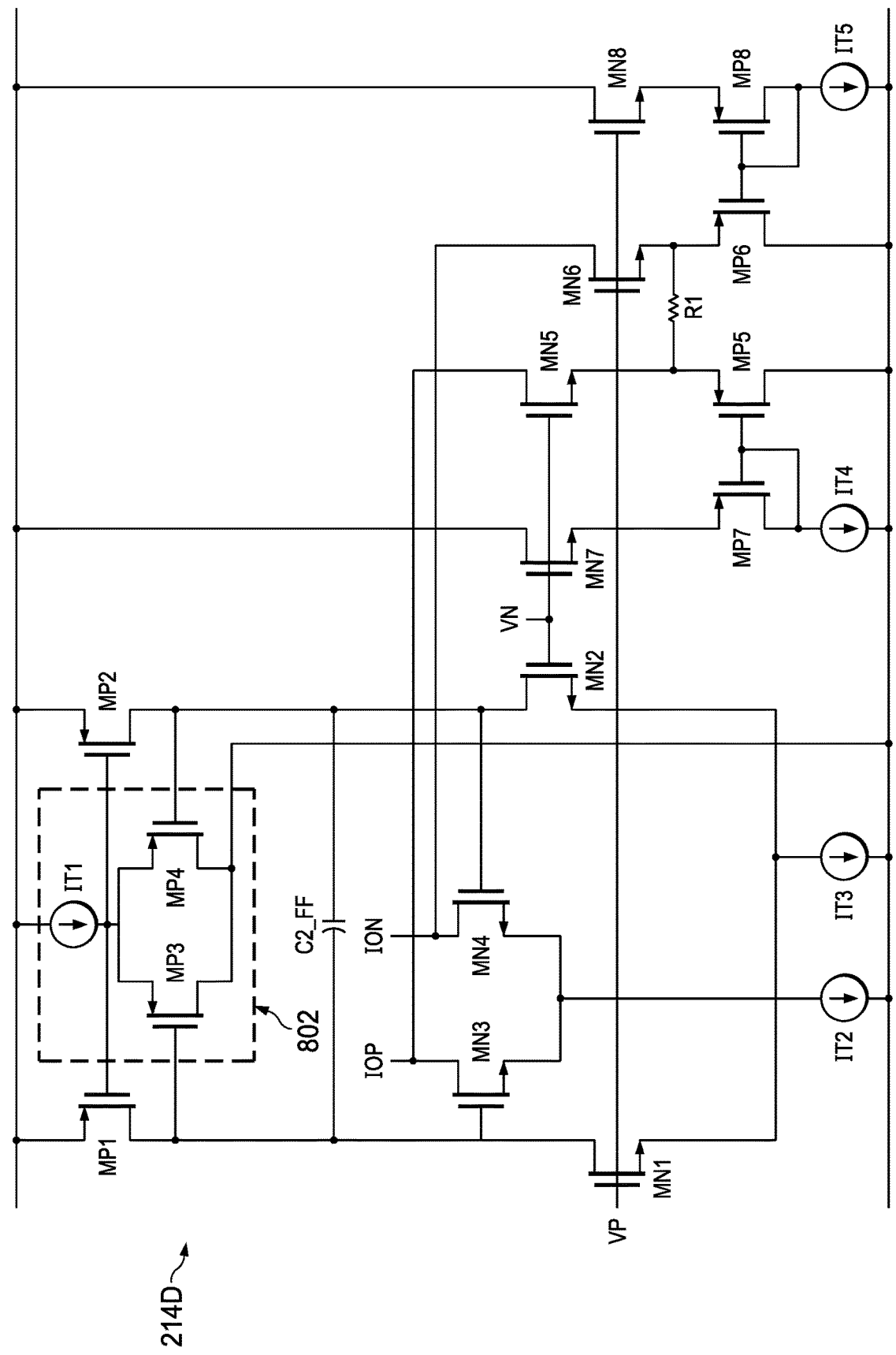

FIGS. 7 and 8 are schematic diagrams of post-filter gain stages 214C and 214D in accordance with various examples. In FIG. 7, the post-filter gain stage 214C is an example of the post-filter gain stage 214 of FIG. 2, the post-filter gain stage 214A of FIG. 4, or the post-filter gain stage 214B of FIG. 5. For the post-filter gain stage 214C, various gain stages such as those discussed previously (e.g., the cascaded gain stages 442 and 444, and feed-forward gain stage 452 in FIG. 4; or the cascaded gain stages 502 and 504, and feed-forward gain stage 506 in FIG. 5) are implemented using transistors (MN1-MN6, MP1, MP2), current sources (IT2-IT4), and a common mode feedback (CMFB) circuit 702. In some examples, the CMFB circuit 702 includes transistors (MP3, MP4) and a current source (IT1).

More specifically, a first cascaded gain stage (e.g., the gain stage 442 in FIG. 4, or the gain stage 502 in FIG. 5) is formed by MN1, MN2, IT3, and the CMFB circuit 702. Also, a second cascaded gain stage (e.g., the gain stage 444 in FIG. 4, or the gain stage 504 in FIG. 5) is formed by MN3, MN4, and IT2. Also, a feed-forward gain stage (e.g., the feed-forward gain stage 452 in FIG. 4, or the feed-forward gain stage 506 in FIG. 5) is formed by MN5, MN6, and IT4. In some examples, IT4 is greater than IT2 to set the input differential range for the feed-forward gain stage (e.g., the feed-forward gain stage 452 in FIG. 4, or the feed-forward gain stage 506 in FIG. 5) higher than the second cascaded gain stage (e.g., the gain stage 444 in FIG. 4, or the gain stage 504 in FIG. 5) such that the post-filter gain stage 214C aids overload recovery. For the post-filter gain stage 214C, the CMFB circuit 702 supports a fully-differential output. Also, in some examples, the feed-forward gain stage (e.g., the feed-forward gain stage 452 in FIG. 4, or the feed-forward gain stage 506 in FIG. 5) is designed to have a non-linear response to extend the input differential range.

In FIG. 8, the post-filter gain stage 214D is an example of the post-filter gain stage 214 of FIG. 2, the post-filter gain stage 214A of FIG. 4, the post-filter gain stage 214B of FIG. 5, or the post-filter gain stage 214C of FIG. 7. For the post-filter gain stage 214D, various gain stages such as those discussed previously (e.g., the cascaded gain stages 442 and 444, and feed-forward gain stage 452) are implement using transistors (MN1-MN8, MP1-MP8), current sources (IT2-IT5), and a CMFB circuit 802. In some examples, the CMFB circuit 702 includes transistors (MP3, MP4) and a current source (IT1).

More specifically, a first cascaded gain stage (e.g., the gain stage 442 in FIG. 4, or the gain stage 502 in FIG. 5) is formed by MN1, MN2, IT3, and the CMFB circuit 702. Also, a second cascaded gain stage (e.g., the gain stage 444 in FIG. 4, or the gain stage 504 in FIG. 5) is formed by MN3, MN4, and IT2. Also, a feed-forward gain stage (e.g., the feed-forward gain stage 452 in FIG. 4, or the feed-forward gain stage 506 in FIG. 5) is formed by MN5-MN8, MP5-MP8, IT4, and IT5. In some examples, a resistor (R1) is positioned between the first current terminals of MP5 and MP6 as shown in FIG. 8. With the post-filter gain stage 114E, the feed-forward stage of FIG. 8 is non-linear to aid large signal response.

FIG. 9 is a graph 900 showing a differential output current as a function of a differential input voltage for a gain stage in accordance with various examples. In some examples, the graph 900 represents the non-linear response of a gain stage such as the feed-forward gain stage represented in FIG. 8. With a non-linear response, a feed-forward gain stage (e.g., the feed-forward gain stage 452 in FIG. 4, the feed-forward gain stage 506 in FIG. 5, or the related components in FIG. 8) aid large signal response. With a non-linear GM2_FF stage for the post-filter gain stage 214D of FIG. 8, a much larger input differential range is supported compared to the post-filter gain stage 214C of FIG. 7. The larger input different range is helpful during large signal events (e.g., startup, brownout, amplifier slew, output overload, etc.), when the inputs of the GM2 stage move apart. Specifically, use of a non-linear GM2_FF stage for a post-filter gain stage 214D (as in FIG. 8) supports a target input differential range that preserves regulation thereby shortening recovery time after a large signal event.

In some examples, the cascaded gain stages of a first post-filter gain stage (e.g., the first post-filter gain stage 214A in FIG. 4, first post-filter gain stage 214B in FIG. 5, the first post-filter gain stage 214C in FIG. 7, or the first post-filter gain stage 214D in FIG. 8) reject offset from the feed-forward gain stage (e.g., GMFF 222 in FIG. 2, or GMFF 422 in FIG. 4) of the second amplifier path (e.g., the second amplifier path 220 in FIG. 2, or the second amplifier path 220A in FIG. 4). In some examples, each of the cascaded gain stages of a first post-filter gain stage (e.g., the first post-filter gain stage 214A in FIG. 4, first post-filter gain stage 214B in FIG. 5, the first post-filter gain stage 214C in FIG. 7, or the first post-filter gain stage 214D in FIG. 8) comprises a differential pair of transistors. Also, the feed-forward gain stage (e.g., GM2_FF 452 in FIG. 4, or GM2_FF 506 in FIG. 5) of the second parallel gain path comprises a differential pair of transistors.

Also, in some examples, a gain stage (e.g., the first post-filter gain stage 214 in FIG. 2, the first post-filter gain stage 214A in FIG. 4, first post-filter gain stage 214B in FIG. 5, first post-filter gain stage 214C in FIG. 7, or the first post-filter gain stage 214D in FIG. 8) comprises a current source (e.g., IT3 in FIGS. 7 and 8) for a first differential pair of transistors (MP1 and MP2, or MN1 and MN2 in FIGS. 7 and 8) associated with the cascaded gain stages (e.g., GM2_1). The gain stage also comprises a second current source (e.g., IT2 in FIGS. 7 and 8) for a second differential pair of transistors (e.g., MN3 and MN4 in FIGS. 7 and 8) associated with the cascaded gain stages (e.g., GM2_2). The gain stage also comprises a third current source (e.g., IT4 in FIGS. 7 and 8) for a third differential pair of transistors (e.g., MN3 and MN4 in FIGS. 7 and 8) associated with the feed-forward gain stage of the second parallel gain path (e.g., GM2_FF), wherein third current source (e.g., IT4) is set to a higher value than the second current source (e.g., IT2).

Certain terms have been used throughout this description and claims to refer to particular system components. This document does not intend to distinguish between components that differ only in name but not in their respective functions or structures. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A chopper amplifier circuit that comprises:
   a first amplifier path with chopper circuitry, a switched-capacitor filter, and multiple gain stages; and
   a second amplifier path with a feed-forward gain stage, wherein a chopping frequency of the chopper circuitry is greater than a threshold frequency at which the second amplifier path is used instead of the first amplifier path;
   wherein the multiple gain stages of the first amplifier path include a first gain stage before the switch-capacitor filter and a second gain stage after the switched-capacitor filter, wherein the second gain stage sets the threshold frequency;
   wherein the second gain stage includes a first parallel gain path with cascaded gain stages, and a second parallel gain path with a feed-forward gain stage.

2. The chopper amplifier circuit of claim 1, wherein the gain of the first parallel gain path is higher than the gain of the second parallel gain path, and wherein the first parallel gain path applies to frequencies below a threshold.

3. The chopper amplifier circuit of claim 1, wherein the cascaded gain stages reject offset from the feed-forward gain stage of the second amplifier path.

4. The chopper amplifier circuit of claim 1, wherein the feed-forward gain stage of the second parallel gain path sets the threshold frequency.

5. The chopper amplifier circuit of claim 1, wherein each of the cascaded gain stages comprises a differential pair of transistors, and wherein the feed-forward gain stage of the second parallel gain path comprises a differential pair of transistors.

6. The chopper amplifier circuit of claim 4, further comprising:
   a first current source for a first differential pair of transistors associated with the cascaded gain stages;
   a second current source for a second differential pair of transistors associated with the cascaded gain stages; and
   a third current source for a third differential pair of transistors associated with the feed-forward gain stage of the second parallel gain path, wherein third current source is set to a higher value than the second current source.

7. The chopper amplifier circuit of claim 1, wherein the feed-forward gain stage of the second parallel gain path has a non-linear response.

8. A system that comprises:
   a chopper amplifier circuit having:
      a first amplifier path with chopper circuitry, a switched-capacitor filter, a first gain stage before the switched-capacitor filter, and a second gain stage after the switched-capacitor filter; and
      a second amplifier path with a feed-forward gain stage, wherein a chopping frequency of the chopper circuitry is greater than a threshold frequency at which the second amplifier path is used instead of the first amplifier path; and
   an input-side circuit configured to provide a differential input signal to the chopper amplifier circuit;
   wherein the second gain stage includes first and second parallel gain paths with different gains.

9. The system of claim 8, wherein the first parallel gain path of the second gain stage includes cascaded gain stages, and wherein the second parallel gain path of the second gain stage includes a feed-forward gain stage.

10. The system of claim 9, wherein the gain of the first parallel gain path is higher than the gain of the second parallel gain path, and wherein the first parallel gain path applies to frequencies below the threshold frequency.

11. The system of claim 8, wherein the chopping frequency is at least two times the threshold frequency.

12. The system of claim 9, wherein each of the cascaded gain stages comprises a differential pair of transistors, and wherein the feed-forward gain stage of the second parallel gain path comprises a differential pair of transistors.

13. The system of claim 12, further comprising:
- a first current source for a first differential pair of transistors associated with a first of the cascaded gain stages;
- a second current source for a second differential pair of transistors associated with a second of the cascaded gain stages; and
- a third current source for a third differential pair of transistors associated with the feed-forward gain stage of the second parallel gain path, wherein third current source is set to a higher value than the second current source.

14. The system of claim 9, wherein the feed-forward gain stage of the second parallel gain path has a non-linear response.

\* \* \* \* \*